(12) United States Patent
Sakai et al.

(10) Patent No.: US 9,442,251 B2
(45) Date of Patent: Sep. 13, 2016

(54) OPTICAL WAVEGUIDE WITH MIRROR, OPTICAL FIBER CONNECTOR, AND MANUFACTURING METHOD THEREOF

(71) Applicant: HITACHI CHEMICAL COMPANY, LTD., Tokyo (JP)

(72) Inventors: Daichi Sakai, Ibaraki (JP); Hiroshi Betsui, Ibaraki (JP); Toshihiro Kuroda, Ibaraki (JP); Kouta Segawa, Ibaraki (JP); Masao Uchigasaki, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/371,566

(22) PCT Filed: Dec. 28, 2012

(86) PCT No.: PCT/JP2012/084137
§ 371 (c)(1),
(2) Date: Jul. 10, 2014

(87) PCT Pub. No.: WO2013/105470
PCT Pub. Date: Jul. 18, 2013

(65) Prior Publication Data
US 2014/0321807 A1   Oct. 30, 2014

(30) Foreign Application Priority Data

Jan. 10, 2012 (JP) .................................. 2012-002414
Aug. 1, 2012 (JP) .................................. 2012-171398

(51) Int. Cl.
*G02B 6/30* (2006.01)
*G02B 6/122* (2006.01)
(Continued)

(52) U.S. Cl.
CPC ................. *G02B 6/30* (2013.01); *G02B 6/122* (2013.01); *G02B 6/136* (2013.01); *G03F 7/16* (2013.01); *G02B 6/43* (2013.01); *G02B 2006/12166* (2013.01)

(58) Field of Classification Search
CPC .................... G02B 2006/12166; G02B 6/122; G02B 6/136; G02B 6/30; G02B 6/43; G03F 7/16
USPC ...................................... 385/14, 31; 430/321
See application file for complete search history.

(56) References Cited

U.S. PATENT DOCUMENTS 5,076,660 A * 12/1991 Messinger ..................... 385/119
5,488,678 A *  1/1996 Taneya et al. .................. 385/14
(Continued)

FOREIGN PATENT DOCUMENTS

JP         4-42756 U       4/1992
JP         7-239422 A      9/1995
(Continued)

OTHER PUBLICATIONS

EP Search of Appln. No. 12865252.6 dated Jul. 21, 2015 in English.
(Continued)

*Primary Examiner* — Peter Radkowski
(74) *Attorney, Agent, or Firm* — Fitch, Even Tabin & Flannery, LLP

(57) ABSTRACT

The optical waveguide with mirror 10 of the present invention includes: a lower clad layer 22; a core pattern 24 formed above the lower clad layer 22; a mirror 30 formed on the inclined surface 31 of the core pattern 24; an upper clad layer 26 covering the part other than the mirror 30 on the core pattern 24; and an opening 26a with an approximate pillar shape, the opening being formed on the upper clad layer 26, wherein the mirror 30 is formed in the opening 26a.

20 Claims, 8 Drawing Sheets

(51) Int. Cl.
*G02B 6/136* (2006.01)
*G03F 7/16* (2006.01)
*G02B 6/43* (2006.01)
*G02B 6/12* (2006.01)

(56) References Cited

U.S. PATENT DOCUMENTS

| | | | | |
|---|---|---|---|---|
| 6,130,976 | A * | 10/2000 | Hoffman et al. | 385/56 |
| 6,640,021 | B2 * | 10/2003 | Pogge et al. | 385/14 |
| 6,663,295 | B2 * | 12/2003 | Kami et al. | 385/92 |
| 6,803,842 | B1 * | 10/2004 | Wong et al. | 335/47 |
| 6,810,160 | B2 * | 10/2004 | Sugama et al. | 385/14 |
| 6,903,490 | B2 * | 6/2005 | Wong et al. | 310/323.17 |
| 6,996,303 | B2 * | 2/2006 | Glebov | G02B 6/1221 385/14 |
| 7,068,871 | B2 * | 6/2006 | Sugama et al. | 385/14 |
| 7,139,448 | B2 * | 11/2006 | Jain | G02B 6/43 385/129 |
| 7,224,857 | B2 * | 5/2007 | Liu | 385/14 |
| 7,418,165 | B2 * | 8/2008 | Glebov | G02B 6/1221 385/130 |
| 7,623,743 | B2 * | 11/2009 | Furuyama | 385/14 |
| 8,644,654 | B2 * | 2/2014 | Wu et al. | 385/14 |
| 8,774,575 | B2 * | 7/2014 | Fujiwara et al. | 385/31 |
| 2002/0118907 | A1 * | 8/2002 | Sugama | G02B 6/12002 385/14 |
| 2003/0091303 | A1 * | 5/2003 | Kami et al. | 385/92 |
| 2004/0131302 | A1 * | 7/2004 | Kouta et al. | 385/14 |
| 2004/0201322 | A1 * | 10/2004 | Wong et al. | 310/328 |
| 2004/0201906 | A1 * | 10/2004 | Wong et al. | 359/824 |
| 2005/0041906 | A1 * | 2/2005 | Sugama et al. | 385/14 |
| 2005/0074207 | A1 * | 4/2005 | Shioda et al. | 385/31 |
| 2005/0111781 | A1 * | 5/2005 | Jain | G02B 6/43 385/15 |
| 2005/0201707 | A1 * | 9/2005 | Glebov | G02B 6/1221 385/132 |
| 2006/0126995 | A1 * | 6/2006 | Glebov | G02B 6/1221 385/15 |
| 2006/0171627 | A1 * | 8/2006 | Aoki et al. | 385/14 |
| 2006/0215963 | A1 * | 9/2006 | Hamano | 385/49 |
| 2007/0104416 | A1 * | 5/2007 | Shimizu et al. | 385/14 |
| 2007/0237470 | A1 | 10/2007 | Aronson et al. | |
| 2008/0181561 | A1 * | 7/2008 | Furuyama | 385/52 |
| 2008/0310848 | A1 * | 12/2008 | Yasuda et al. | 398/115 |
| 2009/0274432 | A1 | 11/2009 | Iwaya | |
| 2010/0000664 | A1 | 1/2010 | Yoshino | |
| 2010/0247030 | A1 * | 9/2010 | Furuyama | 385/14 |
| 2011/0243499 | A1 * | 10/2011 | Fujiwara et al. | 385/31 |
| 2011/0286695 | A1 * | 11/2011 | Wu et al. | 385/14 |

FOREIGN PATENT DOCUMENTS

| | | | | |
|---|---|---|---|---|
| JP | 2001-201646 A | | 7/2001 | |
| JP | 2003-255197 A | | 9/2003 | |
| JP | 2003255197 A | * | 9/2003 | G02B 6/42 |
| JP | 2005-148129 A | | 6/2005 | |
| JP | 2005148129 A | * | 6/2005 | G02B 6/122 |
| JP | 2006178282 A | * | 7/2006 | |
| JP | 2008-102282 A | | 5/2008 | |
| JP | 2008102282 A | * | 5/2008 | |
| JP | 2008-164943 A | | 7/2008 | |
| JP | 2008-310066 A | | 12/2008 | |
| JP | 2009-86256 A | | 4/2009 | |
| JP | 2009-86258 A | | 4/2009 | |
| JP | 2009-200087 A | | 9/2009 | |
| JP | 2009-210669 A | | 9/2009 | |
| JP | 2009200087 A | * | 9/2009 | |
| JP | 2006-178282 A | | 7/2010 | |
| JP | 2010-156868 A | | 7/2010 | |
| JP | 2010-164656 A | | 7/2010 | |
| JP | 2010156868 A | * | 7/2010 | |
| JP | 2010164656 A | * | 7/2010 | |
| JP | 2010-231090 A | | 10/2010 | |
| JP | 2010-232319 A | | 10/2010 | |
| JP | 2010231090 A | * | 10/2010 | |
| JP | 2011-215547 A | | 10/2011 | |
| JP | 2011215547 A | * | 10/2011 | |
| JP | 2011-221288 A | | 11/2011 | |
| JP | 2011221288 A | * | 11/2011 | |
| WO | WO 2008081727 A1 | * | 7/2008 | G02B 6/122 |
| WO | WO 2009045366 A1 | * | 4/2009 | G02B 6/38 |
| WO | 2010/064635 A1 | | 6/2010 | |
| WO | WO 2010064635 A1 | * | 6/2010 | G02B 6/42 |

OTHER PUBLICATIONS

Office Action in TW Appln. No. 101151031 dated Jun. 17, 2016.

* cited by examiner

OPTICAL WAVEGUIDE WITH MIRROR, OPTICAL FIBER CONNECTOR, AND MANUFACTURING METHOD THEREOF

TECHNICAL FIELD

The present invention relates to an optical waveguide with mirror, an optical fiber connector, and a method of manufacturing the same.

BACKGROUND ART

High speed and high density signal transmission among a plurality of electronic devices or among a plurality of circuit boards with an ordinary electric circuit is now encountering a limitation in increase of the speed and density due to mutual interference and attenuation of the electrical signals as barriers.

In order to overcome such limitation in increase of the speed and density, a technique of connecting among electronic devices and among circuit boards by means of light, so-called optical interconnection, is proposed. The combination of electrical wiring and optical wiring has been variously studied for the practical use of an optical interconnection.

An optical waveguide, which has a higher flexibility of wiring and has a capability of more highly densifying wiring compared with an optical fiber, is desired to be used as an optical transmission channel connecting among electronic devices and among circuit boards. In particular, an optical waveguide formed by using a polymer material with excellent processability and economic efficiency and an optical fiber connector provided with this optical waveguide show promise (for example, see Patent Document 1).

As shown in FIG. 12, an optical waveguide 300 generally is laminated to a flexible printed circuit board 340 on which an adhesive layer 342 is formed, and has a lower clad layer 322, a core pattern 324 formed on the lower clad layer 322, the core pattern forming an optical path through which a light signal transmits, and a mirror 330 formed on the inclined surface on the optical path of the core pattern 324 to change the direction of a light signal.

The mirror 330 is formed by deposition, sputtering, plating, and the like. For example, deposition or sputtering is conducted by using a metal mask with an opening corresponding to the inclined surface. Alternatively, the inclined surface is opened by using a resist, deposition, sputtering, or plating is conducted, and then the resist is removed. A mirror protection clad 328 is laminated to the opening in order to protect the mirror 330.

The mirror 330 changes the direction of a light signal so that a light signal transmitting through the optical path exits from the clad layer 322 and so that a light signal entering from the lower clad layer 322 transmits through the optical path.

Generally, the inclined surface on the optical path is formed by cutting with a dicing saw or the like after a lower clad layer, a core pattern, and an upper clad layer are formed. However, when the inclined surface is formed with a dicing saw, the substantial refractive index difference cannot be secured because the boundary between the core and the clad is continuous. Thus, the visibility of the mirror formed on the core may be reduced. Moreover, the reduced thickness of the optical waveguide at the cut portion has a risk of crashing or breaking the product in the following production process of forming specular metal.

Furthermore, an optical waveguide having a void-shaped air reflective mirror changing the optical path by using the refractive index difference between the inclined surface and the air layer has the above-mentioned risk not only in the production process but also after the production process ends.

Another optical waveguide with mirror improves the strength of the position at which the mirror is formed by installing a reinforcing plate on the inclined surface so that the inclined surface of the above-mentioned air reflective mirror is not embedded (for example, see Patent Document 2).

However, in such an optical waveguide with a reinforcing plate, the air layer formed between the mirror for changing an optical path and the reinforcing plate connects with the space outside of the housing of the optical waveguide through at least two positions. Thus, when the optical waveguide is fixed to a connector or another housing by using a liquid adhesive or when the optical waveguide is washed with water for clearing the substrate, capillarity causes liquid to infiltrate into the air layer formed between the mirror for changing the optical path and the reinforcing plate. This causes the mirror for changing the optical path not to reflect light well.

PRIOR ART DOCUMENTS

Patent Documents

Patent Document 1: JP-A-7-239422
Patent Document 2: JP-A-2001-201646

SUMMARY OF THE INVENTION

Problems to be Solved by the Invention

An objective of the present invention is to provide an optical waveguide with mirror and an optical fiber connector which improve the visibility of the mirror, suppress cracks and breaks of products near the part at which a mirror is formed, and have excellent handleability.

Another objective of the present invention is to provide an optical waveguide with mirror, which does hardly allow liquid foreign matter and adhesive for attaching an optical waveguide to invade or infiltrate the mirror for changing an optical path.

Means for Solving the Problems

The optical waveguide with mirror according to the present invention includes a lower clad layer; a core pattern formed above the lower clad layer; a mirror formed on the inclined surface of the core pattern; an upper clad layer covering the optical path other than the mirror on the core pattern; and an opening with an approximate pillar shape on the upper clad layer. The mirror is formed in the opening.

Preferably, the core pattern forms an optical path through which a light signal transmits, the mirror changes the direction of a light signal so that alight signal transmitting through the optical path exits from the lower clad layer and so that a light signal entering from the lower clad layer transmits through the optical path, and the mirror is formed on the optical path. The core pattern may be a dummy core pattern. The mirror may be a dummy mirror for recognizing the position of mirror.

The upper side, the lower side, and the both lateral sides of the inclined surface is preferably placed in the opening.

Viewed in the thickness direction of the optical waveguide with mirror, a void preferably exists between at least one of the upper side, the lower side, and the both lateral sides of the mirror and the inner wall of the opening. Moreover, a clad inclined surface being on the same plane as the inclined surface and continuing from the inclined surface is formed on the lower clad layer in the opening. The clad inclined surface may extend to the outside from at least one of the both lateral sides of the mirror.

The opening preferably is a void.

The optical waveguide with mirror preferably further includes a cover member covering the opening.

The mirror preferably has a metal layer. The metal layer preferably reflects a light signal transmitting through the optical path and a light signal entering from the lower clad layer. The metal layer may be provided on at least one of the upper face and the lateral faces of the core pattern exposed in the opening, and the lower clad layer.

The optical waveguide with mirror is preferably provided with a resin member filled in the opening when the mirror has a metal layer.

The resin member is preferably formed from a photosensitive resin composition.

The lower clad layer, the upper clad layer, and the core pattern are preferably formed from a resin composition for a lower clad layer, a resin composition for an upper clad layer, and a resin composition for a core pattern, respectively. The photosensitive resin composition is preferably any one of the resin composition for a lower clad layer, the resin composition for an upper clad layer, and the resin composition for a core pattern.

The void between the mirror and the cover may connect to the space outside of the optical waveguide with mirror at only one position. In this case, an air vent path connecting the void to the space outside of the optical waveguide with mirror may be formed on the lower clad layer or the upper clad layer. Alternatively, a spacer layer may exist between the upper clad layer and the cover to form an air vent path connecting the void to the space outside of the optical waveguide on the spacer layer. The air vent path is formed by, for example, photolithography.

The air vent path preferably extends to the side opposite to the side on which the core pattern is provided in an axial direction of the core pattern in which the optical path is changed by the mirror.

The optical fiber connector according to the present invention includes the above-mentioned optical waveguide with mirror, a flexible printed circuit board to which the optical waveguide laminates, and an optical fiber guide pattern laminated to the flexible printed circuit board. The optical fiber guide pattern preferably forms a groove to which an optical fiber is introduced so that the optical fiber optically connects with the optical path of the core pattern.

The method of producing the above-mentioned optical waveguide with mirror sequentially includes: a core pattern formation step of forming a core pattern on the lower clad layer; a mirror formation step of forming a mirror on the core pattern; an upper clad layer formation step of laminating an upper clad layer to the surface on which the core pattern is formed; and an opening formation step of forming an opening with an approximate pillar shape by removing the upper clad layer that covers the mirror by photolithography.

The method of producing the optical waveguide with mirror preferably further includes a cover formation step of forming a cover on the opening after the opening formation step.

The method of producing the optical waveguide with mirror preferably further includes a metal layer formation step of forming a metal layer reflecting a light signal to the mirror after the opening formation step.

The method of producing the optical waveguide with mirror preferably further includes a resin filling step of filling the opening with resin after the metal layer formation step.

In the present invention, the method of recognizing the position in the optical waveguide with mirror preferably includes recognizing the position of the mirror based on at least one of the upper side, the lower side, and the both lateral sides of the mirror of the optical waveguide with mirror. Alternatively, the method may include recognizing the position of the mirror by the clad inclined surface. The position of the mirror is preferably observed from the upper clad layer side or the lower clad layer side.

Advantages of the Invention

According to the present invention, since the upper clad layer has a partial opening with an approximate pillar shape not to cover the mirror, the handleability of the optical waveguide is excellent. In addition, since the opening fulfills a function as a conventional metal mask, a mirror having a metal layer is easily formed with a high alignment accuracy. Moreover, since an air layer exists outside the outline of the inclined surface of the mirror or since a metal layer is provided on the inclined surface of the mirror, the position of the mirror is easily visible. Furthermore, since the void in which the mirror is placed connects to the space outside of the optical waveguide with mirror at only one position, an optical waveguide with mirror, which does not allow liquid foreign matter and adhesive for attaching an optical waveguide to hardly invade or infiltrate the air reflective mirror for changing an optical path, can be obtained.

EMBODIMENTS FOR CARRYING OUT THE INVENTION

First Embodiment

Figure 1:
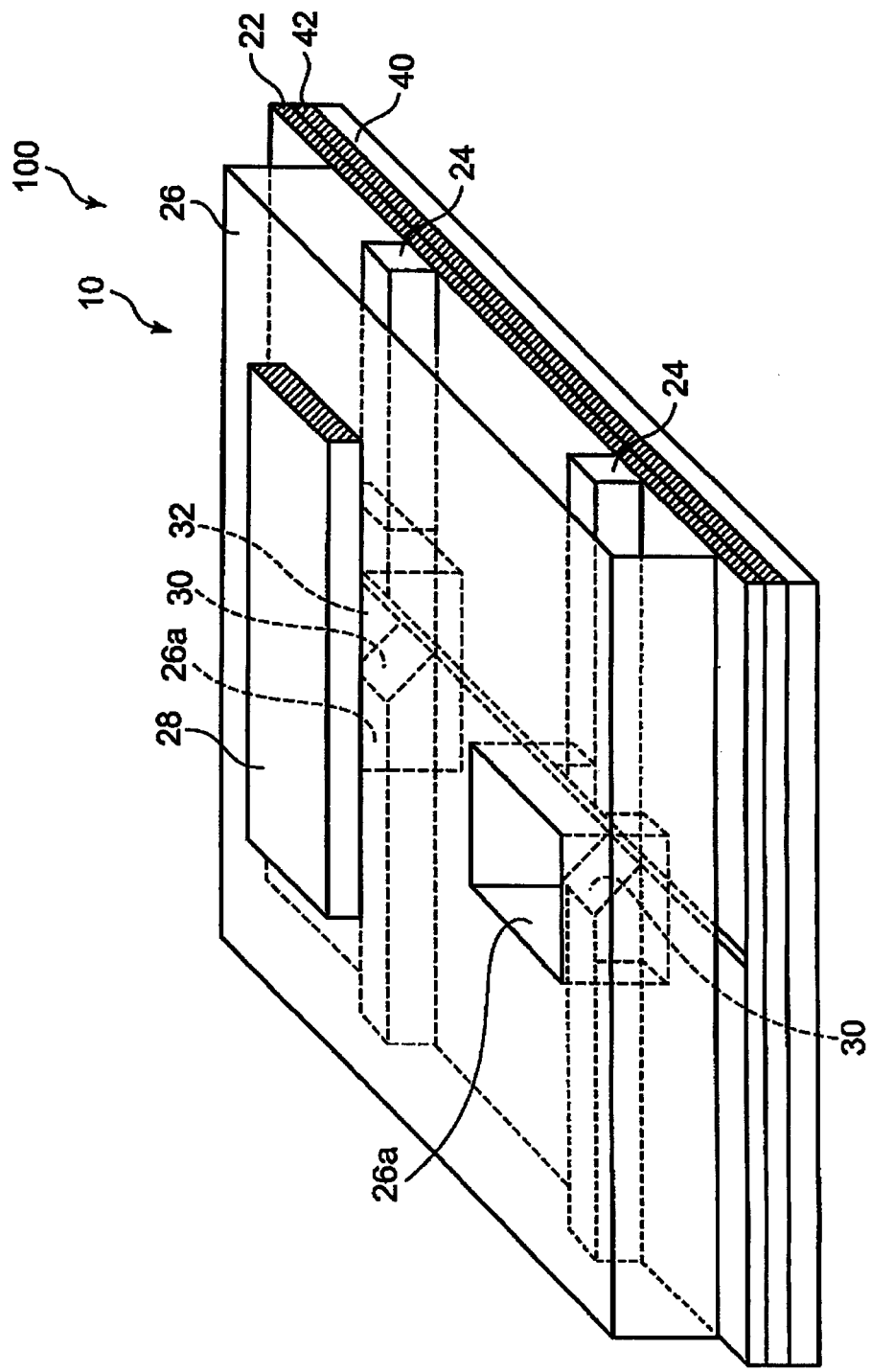
FIG. 1 shows the perspective view illustrating the optical waveguide with mirror and the optical fiber connector according to the first embodiment of the present invention, in which some parts are omitted.
Figure 2:
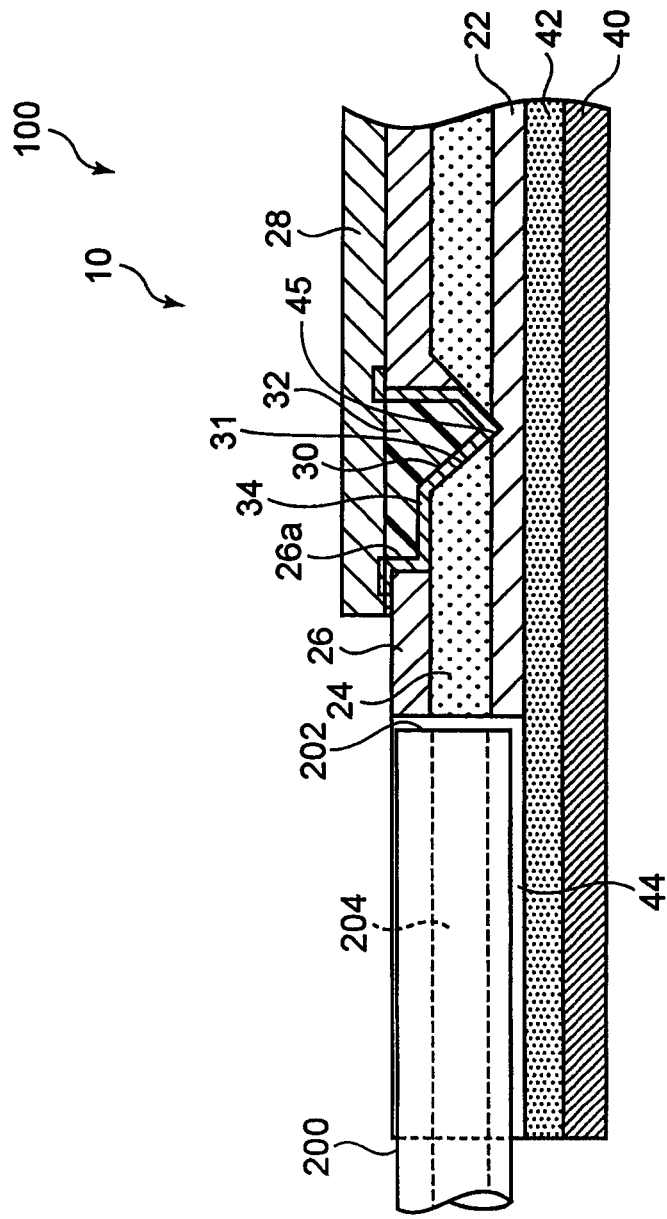
FIG. 2 shows the cross-sectional view illustrating the optical waveguide with mirror and the optical fiber connector that are shown in FIG. 1.

An optical waveguide with mirror 10 and an optical fiber connector 100 according to the first embodiment of the present invention will be explained in reference to FIGS. 1 and 2. In FIGS. 1 and 2, the number of core patterns 24 of the optical waveguide with mirror 10 is explained as two but may be one or may be three or more.

As shown in FIG. 1 and FIG. 2, the optical waveguide with mirror 10 of the present invention is provided with a lower clad layer 22, a plurality of core patterns 24 laminated to the lower clad layer 22, a plurality of mirrors 30 each formed on each optical path of the core patterns 24, an upper clad layer 26 laminated to the lower clad layer 22 so as to cover the core patterns 24, the upper clad layer having a plurality of openings 26a, a plurality of resin members 32 each filled in each of the openings 26a. The optical waveguide with mirror 10 is further provided with a plurality of covers 28 each covering each of the openings 26a.

The openings 26a have an approximate pillar shape, and preferably have a column shape and a polygonal column shape, for example. The approximate pillar shape herein includes a circular truncated cone shape and a polygonal truncated pyramid shape having the inclined sidewall(s). The approximate pillar shape also includes a pillar shape with curved sidewall(s). One mirror 30 is formed in one opening 26a in this embodiment. When two or more mirrors 30 are placed, one opening 26a may include a plurality of mirrors 30 therein as described later. However, the independent opening 26a with an approximate pillar shape is preferably formed for each of the mirrors 30 in the same way as this embodiment because the optical waveguide can be prevented from being cracked and broken near the mirrors 30.

The optical fiber connector 100 of the present invention is provided with an optical waveguide with mirror 10, a substrate 40 to which the optical waveguide with mirror 10 is laminated, and optical fiber guide patterns 44 laminated to the substrate 40.

In the following explanations, the lamination direction of the lower and upper clad layers 22 and 26 is defined as a "thickness direction", the direction perpendicular to the thickness direction and traversing the core patterns 24 is defined as a "transverse direction", and the direction perpendicular to the thickness direction and along which the core patterns 24 extend is defined as a "longitudinal direction".

(Substrate)

The substrate 40 is a flexible printed circuit board, which is, for example, a square-shaped board. An adhesive layer 42 is formed on the surface of the substrate, and a printed circuit is formed on the back surface. The optical waveguide 10 is attached to the substrate 40 through the adhesive layer 42. The flexible printed circuit board is a board substrate formed of a transparent material.

The printed circuit may be or may not be formed on the both surfaces of the flexible printed circuit board. The permeability of a light signal is preferably secured by using a flexible printed wiring board as the substrate. However, when a light signal can transmit through a through hole and the like provided on the substrate, rigid substrates of FR-4, a buildup material, or the like may be used, or these substrates each provided with a printed circuit may be used.

When the lower clad layer 22 has adhesiveness to the substrate 40, the adhesive layer 42 may be omitted.

(Lower Clad Layer)

The lower clad layer 22 is placed on the substrate 40. The lower clad layer 22 is formed in a plate form with a flat surface. The lower clad layer 22 is preferably formed of a material with dimensional stability and thickness.

(Core Pattern)

Each of the core patterns 24 has an elongate shape with a rectangular cross-sectional shape, and is laminated to the lower clad layer 22 to form optical paths through which light signals from a light emitting device (not shown) or an optical fiber 200 transmit. An end of each core pattern 24 are exposed from the upper clad layer 26 and the lower clad layer 22, so that the end optically connects with a core 204 exposed at an end 202 of each optical fiber 200.

However, when the optical waveguide with mirror 10 is not applied to the optical fiber connector, the end of each core pattern 24 is not required to be exposed because the end does not need to be connected with the optical fibers 200.

(Mirror)

Each of the mirrors 30 is formed of the inclined surface 31 formed on each of the core patterns 24 forming optical paths so that light signals transmitting through the core patterns 24 as optical paths are directed to the outside of the lower clad layer 22 and so that light signals entering from the outside of the lower clad layer 22 transmit through the optical paths. The inclined surface 31 is formed from a groove with a V-shaped cross-section, the groove extending in a direction perpendicular to the lamination direction of the lower clad layer 22 (the thickness direction), i.e., a direction traversing the core patterns 24 (the transverse direction). On the inclined surface 31, metal such as gold or aluminum is deposited. Thus, the mirrors 30 are metal mirrors having a metal layer 34 reflecting the light signal transmitting through the optical path and the light signal entering from the lower clad layer 22.

The metal layer 34 is formed on the upper surface and the both lateral surfaces of each core pattern 24, the upper surface of the lower clad layer 22, the clad inclined surface 45 described later, and the inner wall of the opening 26a which are exposed in the corresponding opening 26a. As a result, the metal layer 34 is formed on and around the inclined surface 31. The metal layer 34 that is provided on a position other than the inclined surface 31 may be appropriately omitted.

The grooves with a V-shaped cross section are provided by cutting in the laminated body of core patterns 24 and the lower clad layer 22. At the position on which a core pattern 24 is provided, the above-mentioned inclined surface 31 and the inclined surface (hereinafter referred to as "clad inclined surface 45") formed of the lower clad layer 22 on the same plane as the inclined surface 31 form one inclined surface of the groove. At the position on which the core patterns 24 are not provided, only the clad inclined surface 45 forms one inclined surface of the groove. The clad inclined surface 45 is a continuous plane from one side to the other side of the optical waveguide, which is longer in the transverse direction than the inclined surface 31. Thus, the clad inclined surface 45 extends from the both sides of the inclined surface 31 to the outside in the transverse direction at each core pattern 24.

(Upper Clad Layer)

The upper clad layer 26 is laminated to the lower clad layer 22 so as to cover the optical paths except the mirrors 30 in the core patterns 24.

The upper clad layer 26 has pillar-shaped openings 26a not covering the mirrors 30.

(Cover Member)

Each of the plurality of cover members 28 is large enough to cover each opening 26a, which has, for example, a plate form. The cover members 28 are formed of, for example, the same material by the same production method as those of the upper clad layer 26. However, a film member with an adhesive layer, which is shaped in a desired form, may be attached to the upper clad layer 26 through the adhesive layer to cover the openings 26a instead.

(Resin Member)

Each of the plurality of resin members 32 is resin filled in each of a plurality of openings 26a. For example, each of the resin members 32 may be the same material as any of those of the lower clad layer 22, the core patterns 24, and the upper clad layer 26 or may be formed from a photosensitive resin composition.

(Optical Fiber Guide Pattern)

The optical fiber guide patterns 44 each form a groove in which an optical fiber 200 is introduced so that the optical fiber 200 optically connects with the optical path of each core pattern 24.

Figure 3:
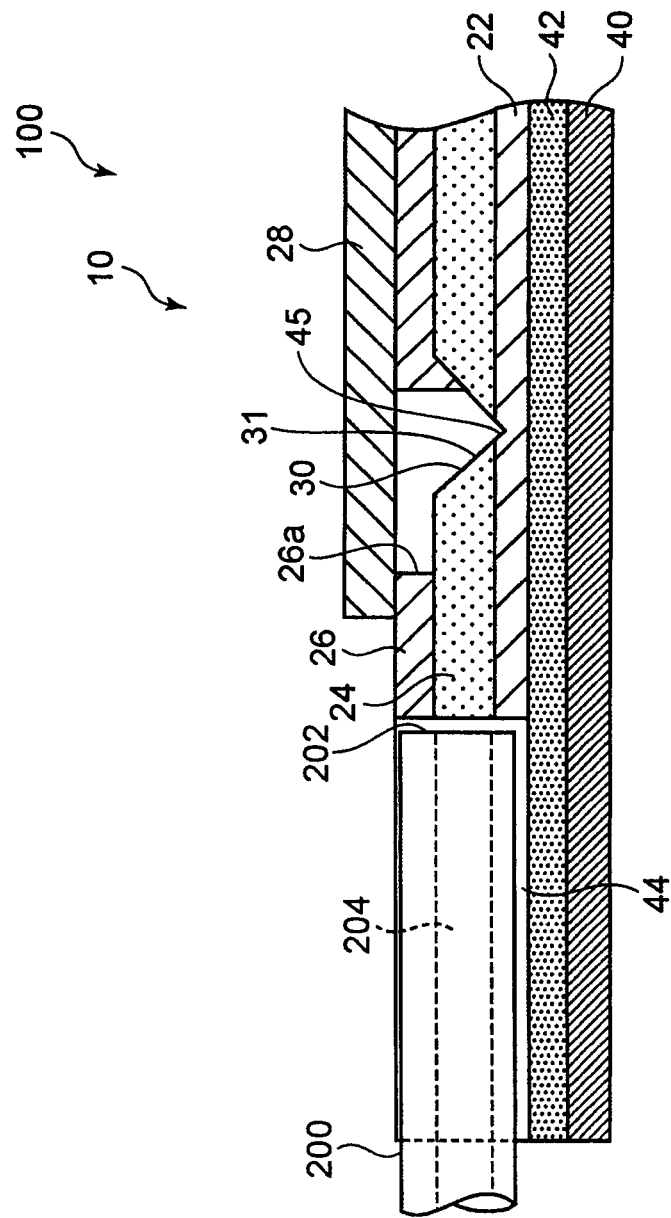
FIG. 3 shows the cross-sectional view illustrating the optical waveguide with mirror and the optical fiber connector but with no resin members in the first embodiment.

In this embodiment, the opening 26a may be filled with resin as described above or may be a void without being filled with resin as shown in FIG. 3. When the opening 26a are void, a metal layer may be formed in the opening 26a. However, the metal layer is not preferably formed in the opening 26a as shown in FIG. 3. When the metal layer is not formed, the inclined surface 31 acts as an air reflective mirror 30 using the refractive index difference with air.

Figure 4:
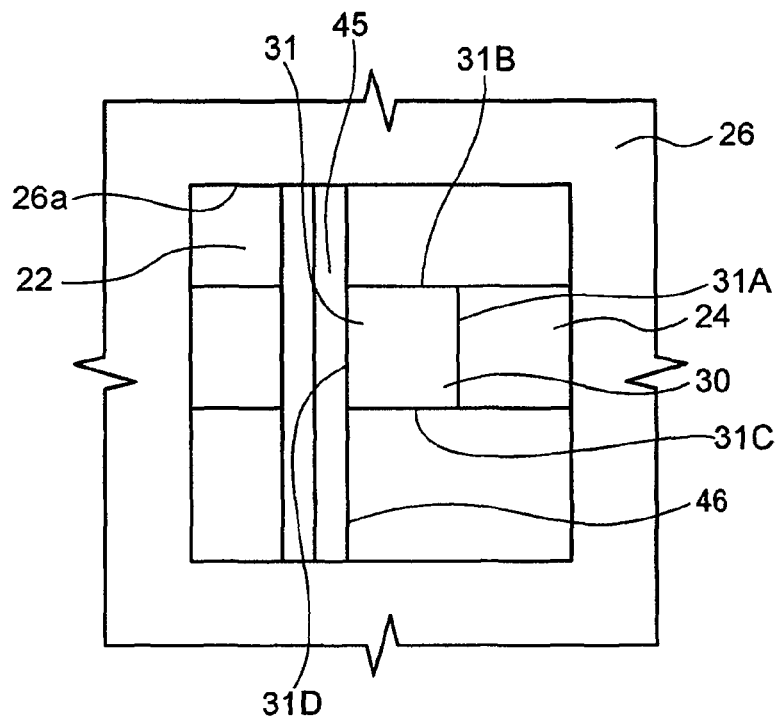
FIG. 4 shows the top view enlarging the image of the mirror and its surroundings of the optical waveguide with mirror that is shown in FIG. 3.

FIG. 4 shows the plan view of a mirror of the optical waveguide with mirror that is shown in FIG. 3, viewed from the above. The mirror in the case in which the resin member is not filled in the opening 26a and in which the metal layer is not formed on the inclined surfaces will be explained below in more detail.

In the optical waveguide with mirror, the mirror 30 formed on the core pattern 24 is formed in the opening 26a as described above. The inclined surface 31 forming a mirror 30 has a square shape. The inclined surface 31 is placed in an opening 26a so that the upper side 31A, the both lateral sides 31B, 31C, and the lower side 31D of the inclined surface 31 does not overlap the inner wall of the opening 26a, viewed from the thickness direction of the optical waveguide. A part of the upper surface, a part of the side surfaces of the core pattern 24 and a part of the lower clad layer 22 are exposed in the opening.

Accordingly, the mirror 30 composed of the inclined surface 31 is exposed without being embedded with the clad layer or the like. The upper side 31A and the both lateral sides 31B and 31C of the inclined surface 31 are a boundary with an air layer, and thus the mirror 30 is easily viewed because of the reflectivity difference. The lower side 31D are continuous to the clad inclined surface 45, which itself hardly viewed. However, the position of the lower side can be recognized from the upper side 46 of the clad inclined surface 45. The clad inclined surface 45 extends to the outside in the transverse direction from the both lateral sides 31B and 31C, and the extending part is placed in the opening 26a. Thus, the upper side 46 of the extending part is a boundary with the air layer and easily viewed. The position of the lower side 31D of the inclined surface 31, which is on the same line as the upper side 46, is easily recognized.

Furthermore, in the above-mentioned explanations, the lower side 31D is one side of the inclined surface 31 on the lower clad layer 22 side, the lateral sides 31B and 31C are the oblique sides continuous from the lower clad layer 22 side of the inclined surface 31 to the upper surface of the core pattern 24, and the upper side 31A is one side on upper surface side of the core pattern 24.

As shown in FIG. 4, a certain void exists between each of the upper side 31A, the both lateral sides 31B, 31C, and the lower side 31D and the inner wall of the opening 26a, viewed in the thickness direction of the optical waveguide. The distance therebetween is preferably 3 μm to 2 mm. In this embodiment, due to the void, the alignment accuracy of the mirror 30 and the opening 26a is easily secured while improving the visibility of the mirror 30, and the opening 26a is easily formed from the viewpoint of the resolution. The void also brings the upper side 46 of the clad inclined surface 45 into contact with an air layer. The distance of 3 μm or more improves the visibility of the mirror 30 and the alignment accuracy when the opening 26a is formed. The distance of 2 tumor less improves the handleability of the optical waveguide and easily secures the flatness of the substrate.

In the above-mentioned explanation in reference to FIG. 4, the resin member is not filled in the opening 26a, and the metal layer is not formed on the inclined surface. However, when the metal layer is formed on the inclined surface, the mirror is easily viewed by the metal layer so as to improve the position distinguishability of the mirror. Moreover, when the opening is filled with the resin member as shown in FIGS. 1 and 2, the metal layer also improves the position distinguishability. For example, when the metal layer is formed on the position other than the inclined surface 31 as described above, i.e., when a metal layer 34 is provided around the inclined surface 31, the metal layer has a concave-convex surface on and around the inclined surface 31 so as to improve the visibility of the mirror 30.

Furthermore, in the method of recognizing the position of a mirror 30, the mirror may be viewed from the lower clad layer side or the upper clad layer side, and is preferably viewed in the thickness direction because the precise position of the mirror 30 can be recognized. The mirror can be recognized by extracting the outline composed of the upper side 31A, the lateral sides 31B and 31C of the inclined surface. The position of the lower side 31D can also be recognized by extracting the upper side 46 that is the outline of the clad inclined surface 45 on the mirror side.

Furthermore, the above-mentioned explanations shows the structure with the void existing between each of the upper side 31A, the both lateral sides 31B, 31C, and the lower side 31D and the inner wall of the opening 26a. However, the void may exist between at least one of these sides and the inner wall of the opening 26a.

(Production Method)

The method of producing the optical waveguide 10 and the optical fiber connector 100 of this embodiment is explained below in reference to FIG. 1 and FIG. 2.

(Substrate)

The substrate 40 is formed by a known production method of a flexible printed circuit board or the like. On one surface of the substrate 40, an adhesive layer 42 is preferably formed in order to easily fix an optical waveguide 10 and optical fibers 200.

(Formation of Lower Clad Layer)

The lower clad layer 22 is formed by using a resin for forming a clad layer or a resin film for forming a clad layer.

The resin for forming a clad layer is not limited in particular as long as being a photosensitive or thermosetting resin composition which has a lower refractive index than the core patterns 24. For the resin for forming a clad layer, a thermosetting resin composition and a photosensitive resin composition can be preferably used. Among the lower clad layer 22, the components used for the resin for forming a clad layer may be or may not be the same, and the refractive index of the resin compositions may be or may not be the same.

The formation method of the lower clad layer 22 is not limited in particular. For example, the lower clad layer may be formed by applying the resin for forming a clad layer or by laminating the resin film for forming a clad layer to the flexible printed circuit board 40 on which the adhesive layer 42 is formed and then by pressure-welding the resin film and the adhesive layer by a lamination method.

The method of forming the clad layer by the application is not limited in particular. The resin composition for forming a clad layer is applied by a conventional method.

When produced by lamination, the resin film for forming a clad layer can be easily produced by, for example, dissolving the resin composition for forming a clad layer in a solvent, applying the dissolved resin composition to a carrier film, and then removing the solvent.

(Formation of Core Pattern and Optical Fiber Guide Pattern: Core Pattern Formation Step)

The formation method of forming a core pattern 24 is not limited in particular. For example, in order not to cause the misalignment of the core patterns 24 with respect to the optical fiber guide patterns the core patterns are preferably formed together therewith by applying the resin for forming a core layer or laminating the resin film for forming a core layer and then by etching 44. In the core patterns 24 and the optical fiber guide patterns 44, the core layer for the core patterns 24 and the optical fiber guide patterns 44 is formed, and then the core layer is simultaneously exposed and developed to form the core patterns 24 and the optical fiber guide patterns 44 at the same time, so that the optical fiber connector can be efficiently produced.

An inclined surface is formed on each of a plurality of core patterns 24 laminated to the lower clad layer 22. The plurality of inclined surfaces is cut surfaces produced by transversely cutting the plurality of core patterns 24 in a V-shape. As a result, the cut surface of each core pattern 24 is an inclined surface.

The angle between each of the inclined surfaces and the longitudinal direction of each core pattern 24 can be appropriately set according to the application. The angle is preferably 30 to 60°, more preferably 40 to 50°, furthermore preferably 44 to 46°.

(Formation of Mirror: Mirror Formation Step)

As long as the mirror 30 can reflect a light signal by the inclined surface, the formation method is not limited. For example, an inclined surface (mirror 30) for changing the optical path is formed by using a cutting means from the side opposite to the flexible printed wiring board side of the core pattern 24 obtained as mentioned above.

The above-mentioned mirror is formed by using laser ablation or a dicing saw, preferably by using a dicing saw.

At the same time of forming a mirror, the clad inclined surface 45 is preferably formed. When the inclined surface formed on the core pattern 24 by using a dicing saw, the dicing blade is preferably cut into the lower clad layer.

(Formation of Upper Clad Layer: Upper Clad Layer Formation Step)

The upper clad layer 26 is preferably formed by the same method as the formation method of the lower clad layer 22.

The formation method of the upper clad layer 26 is not limited in particular as long as covering the inclined surface on which the mirror 30 is formed and the core pattern 24 forming the optical path. The formation method of the upper clad layer 26 may be the approximately same as that of the lower clad layer 22. The method of forming an upper clad layer 26 by application is not limited in particular. The resin composition for forming a clad layer may be applied to the core patterns 24 by a conventional method.

When the upper clad layer is produced by using lamination, the resin film for forming a clad layer is preferably used. In this way, the inclined surface on which the mirror 30 is formed and the core pattern 24 forming the optical path are covered with the resin composition for forming an upper clad layer.

(Formation of Opening: Opening Formation Step)

While the negative photomask having non-exposed area is put on the upper clad layer 26 so that the non-exposed areas of the negative photomask are aligned to cover the mirrors 30, an ultraviolet ray is irradiated thereto through the negative photomask from the carrier film side. Subsequently, the carrier film is removed, and the upper clad layer 26 is etched by using a developer, washed with water, dried by heating and then cured to form openings 26a with a square pillar shape for example.

(Formation of Metal Layer: Metal Layer Formation Step)

As long as the metal layer 34 can reflect a light signal at the inclined surface, the formation method is not limited. The metal layer 34 is provided from on and around the inclined surface of the core pattern 24 to around the opening 26a, but the metal layer only needs to cover at least the inclined surface of the core pattern 24. The part of this metal layer 34 covering the inclined surface 31 composes the mirror 30.

The metal layer 34 is formed by putting a metal mask with an opening having a predetermined size on the openings 26 and then depositing metal capable of reflecting the light signal, such as Au, in the openings 26 with a deposition device.

At this time, the core pattern 24 other than the part near the inclined surface 31 has already been covered with the upper clad layer 26. Thus, even if a metal mask is put on the upper clad layer 26, the metal mask is not brought into contact with the core patterns 24 so as to hardly damage the core patterns 24.

Since the opening 26a of the upper clad layer 26 substitutes for a resist in the metal layer formation step, the deposition position accuracy of the metal layers 34 improves.

Since the metal mask only needs to be aligned with the opening 26a, the alignment accuracy of the metal mask can be reduced. Thus, the working hours for aligning the metal mask can be reduced.

Since the metal layer formation step is conducted above the upper clad layer 26, the heat caused by the metal layer formation step is hardly transferred directly to the core patterns 24. Thus, the core patterns 24 are hardly affected by thermal shock in the deposition.

Since the mirror 30 has the structure of ridge core, the accurate reflection angle of the mirror 30 can be measured with a contact measurement device or the like.

As the material of the metal layer 34, various metals such as Au, Ag, Cu, Cr, Ti, Al, Pd, and Ni are suitably used. Au, Ag, Cu, and Al are more suitably used from the viewpoint of reflectivity.

As long as the mirror 30 has a predetermined reflectivity, the metal layer 34 may be omitted.

When the opening 26a is not filled with a resin member 32, the boundary of the mirror 30 is between the core pattern 24 and the air layer as described above, and therefore, the refractive index difference at the mirror 30 can be increased. Moreover, the visibilities of the inclined surface 31 and the area on which the metal layer 34 is deposited are improved. Furthermore, the amount of metal used for the metal layers 34 can be reduced. Since the refractive index at the mirror 30 is large and since the mirror 30 has the structure of ridge core, the visibility in the process of forming the mirror 30 improves.

(Formation of Resin Member: Resin Filling Step)

The resin members 32 can be formed by a conventional method. Since the resin member 32 is filled in the opening 26a, foreign matter such as dust can be prevented from attaching to the mirrors 30. Moreover, since the mirror 30 and the opening 26a are covered with the resin member 32, the upper clad layer 26 is reinforced by the covering to improve the bending strength of the optical waveguide 10.

(Formation of Cover Member: Cover Formation Step)

The cover member 28 is formed by, for example, the same formation method as that of the upper clad layer 26. The size and the shape of the cover member 28 may be enough to cover a plurality of openings 26a or each of the openings 26a with one cover member 28.

The metal layer formation step, the resin filling step, and the cover formation step may be appropriately omitted according to the structure of the optical waveguide with mirror.

Since the above-mentioned optical waveguide with mirror 10 is provided with an upper clad layer 26 having openings 26a not covering the mirrors 30, the visibility of mirror can be improved due to the refractive index difference between the core patterns and air therearound when the resin member 32 is not provided. On the other hand, when the opening is filled with the resin after metal layer is provided for the mirror, the position of the mirror is easily viewed due to the metal layer, and the reflectivity of the mirrors 30 can be increased. In addition, since the opening 26a fulfill a function as a conventional metal mask, the mirror 30 can be easily formed with high alignment accuracy. Furthermore, since the opening 26a is provided on only the part on which the mirror 30 is provided, the optical waveguide with mirror, which suppresses the cracks and breaks of product near the part at which the mirror is formed and which has excellent handleability, can be obtained.

The above-mentioned core patterns are described as the example of the core patterns for optical transmission. However, the core patterns may comprise a dummy core pattern not used for optical transmission. The mirror may not be used for light reflection as well. The mirrors may comprise a dummy mirror used only for the position recognition. The dummy mirror is preferably aligned with one or two or more mirrors (namely, mirrors for the light reflection) on the core patterns transmitting a light signal along the transverse direction (i.e., the vertical direction to the optical axis of the core pattern transmitting light signal). This enables the position of the mirror for light reflection to be recognized by the dummy mirror without the above-mentioned structure capable of position recognition. The height from the lower side to the upper side of this dummy mirror should be equal to that of the mirror for light reflection, but the width between both lateral sides of this dummy mirror may be appropriately selected.

The mirror with the metal layer and the mirror without the metal layer may coexist. For example, the mirror for light reflection may not be provided with the metal layer while the dummy mirror only used for the position recognition may be provided with the metal layer.

The shape of the dummy core pattern is not limited in particular. However, the dummy core pattern provided in parallel with the core pattern transmitting light signals as described above enables a dummy mirror to be formed together when the mirror for light reflection is formed with, for example, a dicing saw, so that high alignment accuracy is easily obtained.

The dummy mirror is preferably formed at the same time when the mirror for light reflection is formed by using a cutting means.

Second Embodiment

Figure 5:
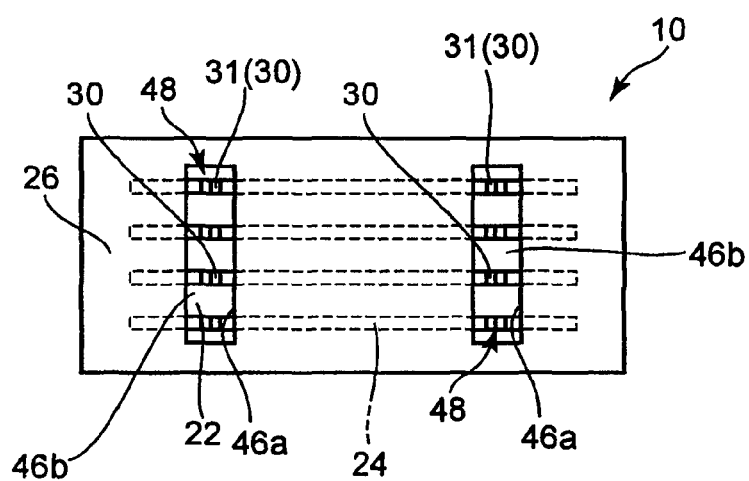
FIG. 5 shows the top view illustrating the optical waveguide with mirror according to the second embodiment of the present invention, in which the cover is omitted.

Next, the second embodiment of the present invention will be explained in reference to FIG. 5. The below-mentioned embodiments will be explained by assigning the reference numbers of other embodiments to the components when these components are the same as those of other embodiments.

In the same way as the first embodiment, the optical waveguide for a mirror 10 of the second embodiment has a lower clad layer 22, an upper clad layer 26, core pattern 24 placed between the lower clad layer 22 and the upper clad layer 26 and embedded in these clad layers, a mirror 30 for changing the optical path formed on the core pattern 24, a cover member (not shown) provided on the mirror 30, and a substrate (not shown). The mirror 30 are air reflective mirrors without a metal layer 34 being formed.

The optical waveguide 10 of this embodiment is provided with two mirrors 30, 30 on each of the core patterns 24. The optical waveguide enables light signals to input and output from the lower clad side. Therefore, the optical waveguide 10 is provided with no optical fiber guide patterns. However, this embodiment may be provided with optical fiber guide pattern in the same way as the first embodiment.

In the first embodiment, groove is provided on the lower clad layer by cutting. However, in this embodiment, the groove is formed as a notch 48 with a V-shaped section that is provided only on the core pattern 24 without cutting into the lower clad layer. On each of the core patterns 24, the inclined surface 31 at the optical waveguide center side of each notch 48 forms a mirror 30 for changing an optical path in the same way as the first embodiment. The notches 48 and the mirrors 30 for changing the optical path in core patterns 24 are aligned at the same position in the longitudinal direction. Thus, the notches and the mirrors are aligned in the transverse direction. The mirrors 30 incline to the axial direction of the core patterns 24 in the same way as the first embodiment. This enables the light with an optical path changed by the mirrors 30 to transmit in parallel with the thickness direction. This also enables light transmitting in parallel with the thickness direction to efficiently enter the core patterns 12.

The notches 48 are formed with a dicing saw, laser ablation, or the like, for example, before the upper clad layer 26 is laminated to the core patterns 24 but after the core patterns 24 are formed, in the same way as the first embodiment.

The upper clad layer 11B has openings 46a at the positions each corresponding to the notches 48. The openings 46a are pillar-shaped openings (i.e., hole) that does not open at the outer periphery of the optical waveguide in the same way as the first embodiment. The openings 46a have a rectangular shape lengthening in the transverse direction to overlap the parts on which a plurality of notches 48 (mirrors 30) aligning in the transverse direction are provided and therearound, viewed from above.

Thus, in this embodiment, a plurality of mirrors are placed in one opening 46a, and the upper side, the both lateral sides, and the lower side of each mirror 30 (inclined surface 31) are placed to form a void between the mirror and the inner wall of the opening 46a. The distance of the void is preferably 3 μm to 2 mm as well as the first embodiment.

In the second embodiment, a cover member as a reinforcing plate are laminated to the upper clad layer 26 (not shown) in the same way as the first embodiment as well. The opening 46a composes a hollow space (void 46b) with the upper part of the opening 46a closed by the reinforcing plate and the lower surface formed of the core patterns 24 and the lower clad layer 22. A plurality of mirrors 30 are placed in the hollow void 46b.

Since the outer periphery of each mirror is an air layer according to the above-mentioned structure, the visibility of the mirror can be improved in the second embodiment as well. The opening 46a are not formed by cutting so that the opening do not penetrate the optical waveguide 10 from one lateral side to another of in the same way as the first embodiment. This suppresses cracks and breaks of product near the part at which the mirror is formed.

Third Embodiment

Figure 6:
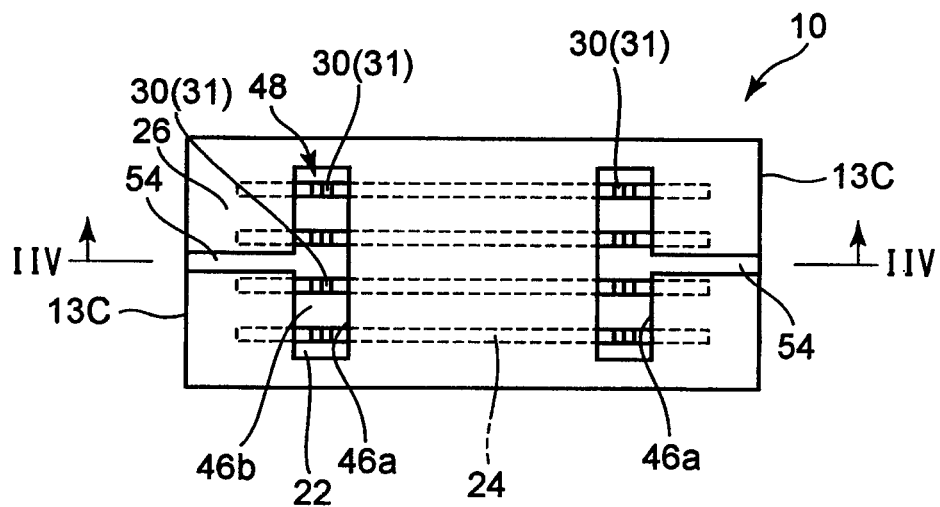
FIG. 6 shows the top view illustrating the optical waveguide with mirror according to the third embodiment of the present invention, in which the cover is omitted.
Figure 7:
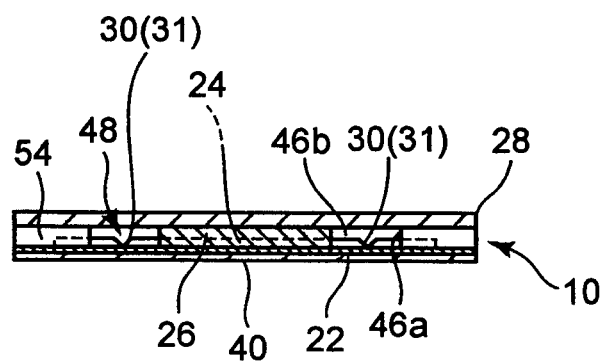
FIG. 7 shows the cross-sectional view on the line IIV-IIV in FIG. 6 from the arrow direction.
Figure 8:
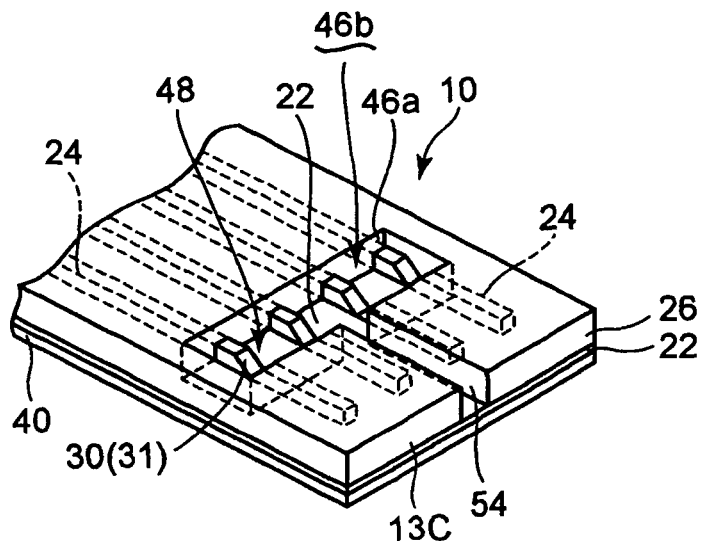
FIG. 8 shows the perspective view illustrating the optical waveguide with mirror according to the third embodiment of the present invention, in which the cover is omitted.

FIGS. 6 to 8 show the diagram illustrating the optical waveguide with mirror of the third embodiment.

The third embodiment is different from the second embodiment on the point that the upper clad layer 26 is provided with an air vent path 54. The difference between the second embodiment and the third embodiment will be explained below. FIGS. 6 to 8 show an example with no adhesive layers on the substrate 40. However, an adhesive layer may exist.

In this embodiment, a part of upper clad layer 26 is linearly removed. The upper part of the removed part is covered with a cover member 28 (reinforcing plate), and the lower surface is covered with a lower clad layer 22 so as to form an air vent path 54.

The length of the air vent path 54 is not limited but is preferably 50 μm to 50 mm. The length of 300 μm or more is more preferable because the infiltration of adhesive used for fixing the optical waveguide and cleaning solution during cleaning can be decreased. The air vent path 54 of this embodiment is linear but may be curve. The height of the air vent path 54 (length in the thickness direction) is preferably 5 μm to 150 μm. The height of 5 μm or more prevents the air vent path 54 from being embedded with the cover member 28 or the adhesive layer formed on the cover member 28 when the cover member 28 is laminated. When the height is 150 μm or less, the air vent path is easily shaped. The width of the air vent path 54 is preferably 5 μm to 500 μm. The width of 5 μm or more easily forms the air vent path 54. The width of 500 μm or less prevents the air vent path 54 from being embedded with the cover member 28 or the adhesive layer when the cover member 28 is laminated. The air vent path 54 is placed between two core patterns 24.

The air vent path 54 extends in the longitudinal direction from a part of the opening 46a that is on one end face 13C side outwardly to one end face 13C of the optical waveguide 10 and opens at the end face 13C. This is preferable because the air vent path 54 extends in an axis direction of the core patterns to easily secure the length of the air vent path 54. The air vent path 54 extends to the side opposite to the side on which the core patterns 24 of which the optical paths are changed by the mirrors 30 are provided.

The openings 46a provided on the upper clad layer 26 are formed by, for example, laminating a sheet-shaped upper clad layer to the core patterns 24 on which the mirrors 30 have been formed and then by etching and removing a part of the upper clad layer 26 that the mirrors 30 overlap by photolithography, in the same way as the first embodiment.

The formation method of an air vent path 54 is not limited in particular. The air vent path 54 may be formed by laser ablation or may be formed by photolithography at the same time when openings 46a are formed by photolithography.

The cover member 28 is laminated to the upper clad layer 26 on which openings 46a and air vent paths 54 have been formed so as to close the upper part of the opening 46a, resulting in forming the void 46b that is a hollow space, and thus the optical waveguide with mirror 10 is obtained.

In the third embodiment, the upper clad layer 26 is preferably formed of a material capable of photolithography for forming the opening 46a and the air vent path 54. The material is more preferably a photosensitive resin composition.

The air vent path 54 may be formed on the lower clad layer 22. In this case, the lower clad layer 22 is preferably formed of a material capable of photolithography and is more preferably formed of a photosensitive resin composition, when the air vent path 54 are shaped by photolithography.

In the structure of the above-mentioned third embodiment, the pillar-shaped hollow space (void 46b) is provided in the optical waveguide 10. The void 46b is connected to the outside of the optical waveguide with mirror 10 through the air vent path 54. Only one air vent path 54 that is connected to the hollow space is provided. In other words, the hollow space (void 46b) is connected to the outside of the optical waveguide with mirror 10 at only one position. Thus, in this embodiment, liquid foreign matter and adhesive for attaching to an optical waveguide is hardly infiltrated in the space in which the air reflective mirrors 30 are placed. The outside of the optical waveguide with mirror 10 and the inside of the optical waveguide 10 can be communicated to each other at any position, which improves the convenience. In addition, since the void 46b is not a closed space, the air reflective mirrors 30 are prevented from being transformed by thermal expansion or the like of the void 46b that is caused by heating.

Fourth Embodiment

Figure 9:
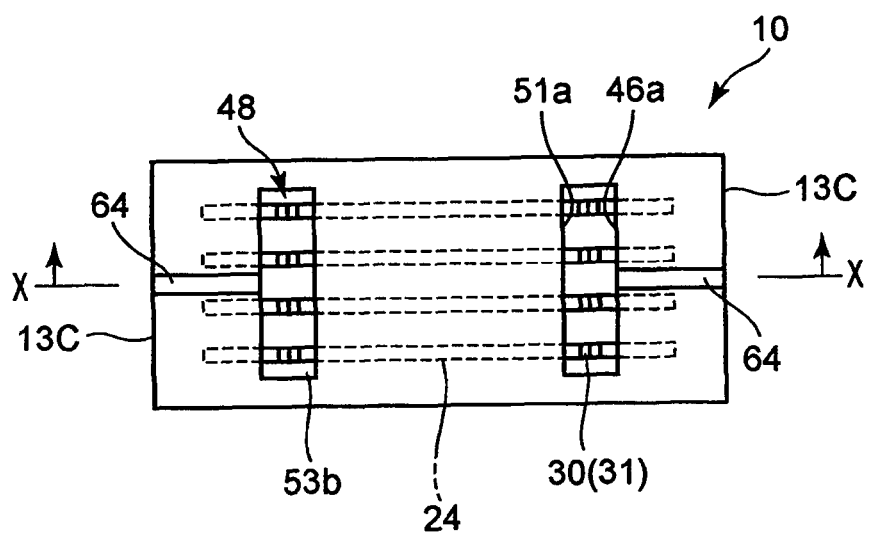
FIG. 9 shows the top view illustrating the optical waveguide with mirror according to the fourth embodiment of the present invention, in which the cover is omitted.
Figure 10:
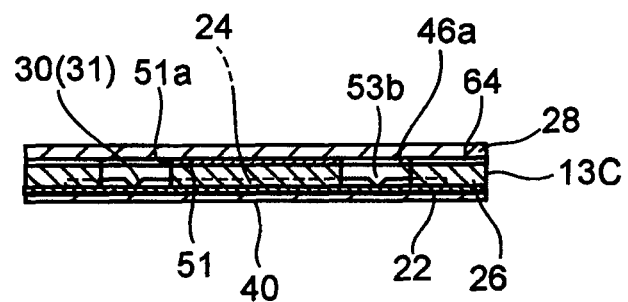
FIG. 10 shows the cross-sectional view on the line X-X in FIG. 9 from the arrow direction.
Figure 11:
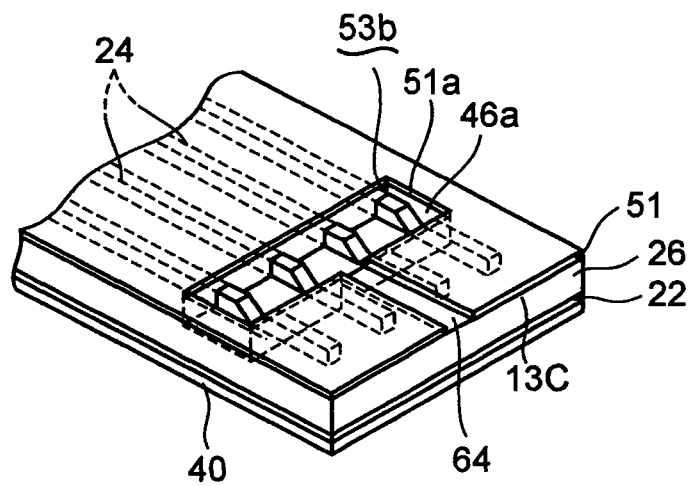
FIG. 11 shows the perspective view illustrating the optical waveguide with mirror according to the fourth embodiment of the present invention, in which the cover is omitted.
Figure 12:
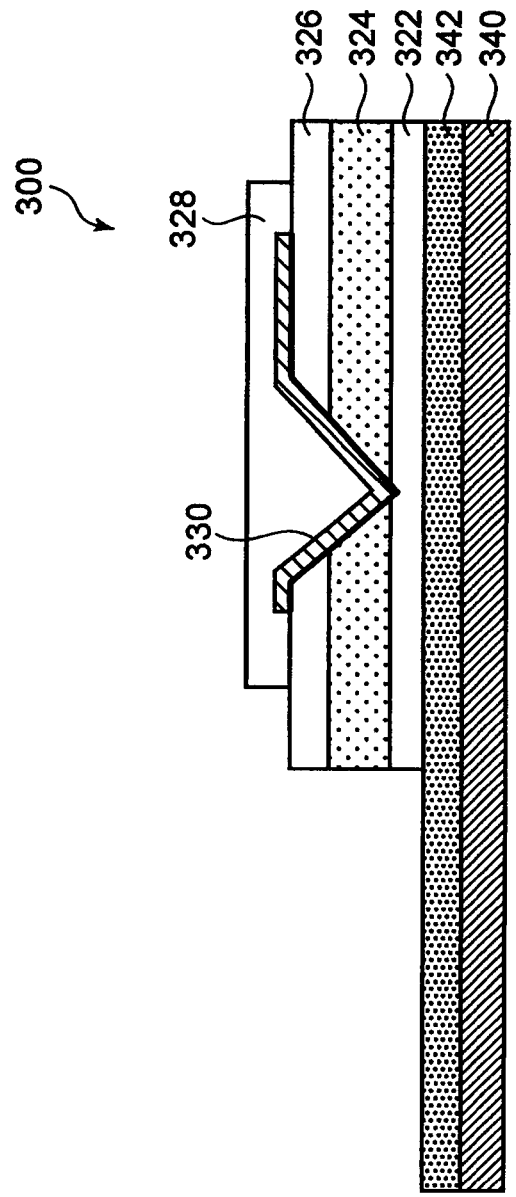
FIG. 12 shows the perspective view of a conventional optical waveguide with mirror and a conventional optical fiber connector.

The fourth embodiment will be explained in reference to FIGS. 9 to 11. The air vent path in the third embodiment is provided on the clad. However, the air vent path in this embodiment is not provided on the clad but provided on a spacer layer 51 provided above the upper clad layer 26. The difference between the third embodiment and the fourth embodiment will be explained below.

In this embodiment, the lower clad layer 22 and the core patterns 24 are provided, and the mirrors 30 formed of inclined surfaces 31 are provided by the notches 48 on the core patterns 24, in the same way as the third embodiment.

Moreover, the openings 46*a* are provided on the upper clad layer 26 in the same way as the third embodiment. The spacer layer 51 is laminated to the upper clad layer 26, and the cover member 28 as a reinforcing plate is laminated to the upper clad layer 26 through the spacer layer 51.

The thickness of the spacer layer 51 is not limited in particular. However, the thickness is preferably 5 μm to 150 μm because the thickness of the spacer layer 51 corresponds to the height of the air vent path 64.

In this embodiment, on a part of the spacer layer 51, an opening 51*a* composed of a hole with the same plane-viewed shape as that of the opening 46*a* is provided at the position corresponding to the opening 46*a* of the upper clad layer 26. The openings 46*a* and 51*a* form hollow pillar-shaped void 53*b* in the optical waveguide.

A part of the spacer layer 51 is linearly removed. The top and bottom of the removed part is closed by the cover member 28 and the upper clad layer 26 respectively to form an air vent path 64. The air vent path 64 is placed between two core patterns arranged in the transverse direction in this embodiment. The air vent path 64 extends in the longitudinal direction from the hollow void 53*b* (openings 51*a*) and opens at the end face 13C in the same way as the second embodiment. As a result, the hollow space 53*b* is connected to the outside of the optical waveguide with mirror 10 through an air vent path 64. In the fourth embodiment, only one air vent path 64 that is connected to the hollow void 53*b* is provided. Accordingly, the hollow void 53*b* is connected to the outside of the optical waveguide with mirror 10 at only one part. Thus, liquid foreign matter and adhesive for attaching to an optical waveguide is hardly infiltrated in the space in which each air reflective mirror 30 is placed.

Forming an air vent paths 64 on the spacer layer 51 can reduce the height of the air vent path 64. This makes it harder for air to enter and exit the hollow void 53*b* so as to prevent the mirrors 30 from being oxidized. The outside of the optical waveguide with mirror 10 and the inside of the optical waveguide can be communicated to each other at any position, which improves the convenience. In addition, since the void 53*b* is not the closed space, the mirrors 30 are prevented from being transformed even when heated.

The formation process of the optical waveguide with mirror in the fourth embodiment will explained bellow, for example.

The cover member 28 with the spacer layer 51 having a function as an adhesive layer is prepared. In this spacer layer 51, air vent paths 64 and openings 51*a* are formed. The laminated body of a lower clad layer 22, core patterns 24, an upper clad layer 26, which has mirrors 30 and openings 46*a* formed on the upper clad layer 26, are also prepared. Then, the above-mentioned laminated body is attached to the cover member 28 with a spacer layer 51 so that the openings 46*a* of the upper clad layer 26 are fit in the openings 51*a* of the spacer layer 51 to form hollow voids 53*b* which are connected to the air vent paths 64 to obtain an optical waveguide with mirror 10.

Alternatively, the optical waveguide with mirror 10 may be obtained by preparing the above-mentioned laminated body having the openings 46*a* and the mirrors 30; laminating a spacer layer 51 to the upper clad layer 26 of the laminated body; forming the air vent path 64 and the opening 51*a* on the spacer layer 51 by photolithography; and then laminating the cover member 28 to the spacer layer 51.

Alternatively, the optical waveguide with mirror 10 may be obtained by laminating a sheet-shaped sheet upper clad layer 26; exposing the upper clad layer 26 with a pattern capable of forming the openings 46*a*; further laminating a spacer layer 51 to the upper clad layer 26; exposing the spacer layer 51 with a pattern capable of forming the air vent paths 64 and the openings 51*a*; forming the openings 46*a* on the upper clad layer 26 as well as the air vent paths 64 and the openings 51*a* on the spacer layer 51 by etching; and then laminating a cover member 28 to the spacer layer 51.

When photolithography is used as the method of forming the air vent paths 34 and the hole 33 on the spacer layer 51, a photosensitive spacer layer 51 is preferably used. In this case, the above-mentioned resins for forming a clad layer or a core layer can be used.

In the above-mentioned second to fourth embodiments, the metal layer 34 may be formed on the inclined surface 31. In the second embodiment, the void 46*b* may be filled with the resin member.

Furthermore, in the second to fourth embodiments, the core patterns are described as the example of the core pattern for optical transmission. However, in the same way as the first embodiment, the core patterns may comprise a dummy core pattern not used for optical transmission. The mirrors may comprise a dummy mirror not used for light reflection but used only for the position recognition.

In addition, in the second to fourth embodiments, the shape of the opening is not limited to a rectangle. The openings may have another shape such as a columnar shape. In the above-mentioned third and fourth embodiments, two or more elongated core patterns exist, and two or more mirrors are placed in one hollow space. In the same way as the first embodiment, a plurality of hollow spaces not communicating to each other may be formed according to the number of mirrors. In each of the isolated spaces, each of the mirrors for changing an optical path may be placed. In this case, one air vent path is communicated to each of the hollow spaces, and each of the hollow spaces is connected to the outside of the optical waveguide with mirror through only one air vent path.

In the above-mentioned each embodiments, core patterns 24 are provided on the flat lower clad layer 22. However, concaves for forming core patterns may be provided on the lower clad layer 22. In this case, the core patterns 24 are formed by filling material for forming a core in the concaves. The upper clad layer 26 is provided so that the upper clad layer is laminated to the lower clad layer 22 with concaves on which core patterns 24 are formed.

EXAMPLES

The present invention will be explained in reference to the examples in detail below but is not limited to the following examples without departing the scope of the invention.

Example 1

Preparation of Resin Film for Forming Clad Layer

[Preparation of Base Polymer (A): (Meth)acrylic Polymer (A-1)]

46 parts by mass of propylene glycol monomethyl ether acetate and 23 parts by mass of methyl lactate were weighed and placed in a flask equipped with an agitator, a condenser, a gas introduction tube, a dropping funnel and a thermometer, and stirred with nitrogen gas introduced therein. The liquid temperature was increased to 65° C. Subsequently, a mixture of 47 parts by mass of methyl methacrylate, 33 parts by mass of butyl acrylate, 16 parts by mass of 2-hydroxyethyl methacrylate, 14 parts by mass of methacrylic acid, 3 parts by mass of 2,2'-azobis(2,4-dimethylvaleronitrile), 46 parts by mass of propylene glycol monomethyl ether acetate and 23 parts by mass of methyl lactate was added dropwise for 3 hours and stirred at 65° C. for 3 hours, then stirred at 95° C. for 1 hour to obtain the (meth)acrylic polymer (A-1) solution (solid content: 45 mass %).

[Measurement of Weight Average Molecular Weight]

The weight average molecular weight (standard polystyrene conversion) of the polymer (A-1) measured with a GPC instrument ("SD-8022," "DP-8020," and "RI-8020" available from Tosoh Corporation) was $3.9 \times 10^4$. The columns used were Gelpack GL-A150-S and Gelpack GL-A160-S, available from Hitachi Chemical Co., Ltd.

[Measurement of Acid Value]

The acid value of the polymer (A-1) measured was 79 mgKOH/g. The acid value was calculated from the amount of a 0.1 mol/L potassium hydroxide aqueous solution that was required for neutralizing the polymer (A-1) solution. The point where phenolphthalein added as an indicator was changed from colorless to pink color was designated as the neutralization point.

[Preparation of Resin Varnish for Forming Clad Layer]

84 parts by mass (solid content: 38 parts by mass) of the polymer (A-1) solution (solid content: 45 mass %) as the base polymer (A); 33 parts by mass of urethane (meth) acrylate having a polyester skeleton ("U-200AX" available from Shin-Nakamura Chemical Co., Ltd.) and 15 parts by mass of urethane (meth)acrylate having a polypropylene glycol skeleton ("UA-4200" available from Shin-Nakamura Chemical Co., Ltd.) as the photo-curable component (B); 20 parts by mass (solid content: 15 parts by mass) of polyfunctional blocked isocyanate solution formed by protecting an isocyanurate trimer of hexamethylene diisocyanate with methyl ethyl ketone oxime (solid content: 75 mass %) ("Sumidur BL3175" available from Sumika Bayer Urethane Co., Ltd.) as the thermosetting component (C); 1 part by mass of 1-[4-(2-hydroxyethoxy)phenyl]-2-hydroxy-2-methyl-1-propan-1-one ("Irgacure 2959" available from Ciba Japan K.K.) and 1 part by mass of bis(2,4,6-trimethylbenzoyl)phenylphosphine oxide ("Irgacure 819" available from Ciba Japan K.K.) as the photopolymerization initiator (D); and 23 parts by mass of propylene glycol monomethyl ether acetate as an organic solvent for dilution were mixed while being stirred. The mixture was filtered under increased pressure with a Polyflon filter with a pore diameter of 2 μm ("PF020" available from Advantec Toyo Co., Ltd.) and then defoamed under reduced pressure to obtain a resin varnish for forming a clad layer.

The obtained resin composition for forming a clad layer was applied on the non-treated surface of a PET film ("COSMOSHINE A4100" available from Toyobo Co., Ltd., thickness: 50 μm) with the coating machine and then dried at 100° C. for 20 minutes. Subsequently, a surface-release PET film ("Purex A31" available from Teijin DuPont Films Japan Ltd., thickness: 25 μm) as a protective film was laminated to the dried resin composition to obtain a resin film for forming a clad layer. The thickness of the resin layer may be arbitrarily adjusted by changing the gap of the coating machine. The thickness of the first lower clad layer and the second lower clad layer (adhesive layer) used in Examples will be described in the respective Example. The film thicknesses after cured and after coated of the first lower clad layer and the second lower clad layer were same. The thickness of the resin film for forming an upper clad layer used in Examples will be described in the respective Example. The thickness of the resin film for forming an upper clad layer described in Examples is measured after the coating.

[Preparation of Resin Film for Forming Core Layer]

The resin varnish B for forming a core layer was prepared in the same way and under the same conditions as the above-mentioned preparation example except that 26 parts by mass of phenoxy resin (product name: PHENOTOHTO YP-70, available from Tohto Kasei Co., Ltd) was used as the base polymer (A), 36 parts by mass of 9,9-bis[4-(2-acryloyloxyethoxy)phenyl]fluorene (product name: A-BPEF, available from Shin-Nakamura Chemical Co., Ltd.) and 36 parts by mass of bisphenol A epoxy acrylate (product name: EA-1020, available from Shin-Nakamura Chemical Co., Ltd.) were used as the photopolymerizable compound (B), 1 part by mass of bis(2,4,6-trimethylbenzoyl)phenylphosphine oxide (product name: Irgacure 819, available from Ciba Specialty Chemicals Inc.) and 1 part by mass of 1-[4-(2-hydroxyethoxy)phenyl]-2-hydroxy-2-methyl-1-propane-1-one (product name: Irgacure 2959, available from Ciba Specialty Chemicals Inc.) were used as the photopolymerization initiator (C), and 40 parts by mass of propylene glycol monomethyl ether acetate was used as an organic solvent. The resulting varnish B was filtered under increased pressure and then defoamed under reduced pressure in the same way and under the same conditions as the above-mentioned preparation example.

The resulting resin varnish B for forming a core layer was applied to an untreated surface of a PET film (product name: COSMOSHINE A1517, available from Toyobo Co., Ltd., thickness: 16 μm) and then dried in the same way as the above-mentioned preparation example. Subsequently, a surface-release PET film (product name: Purex A31, available from Teijin DuPont Films, thickness: 25 μm) as a protective film was laminated to the dried resin composition so that the releasing surface is attached to the resin side to obtain a resin film for forming a core layer. The thickness of the resin layer may be arbitrarily controlled by changing the gap of the coating machine. The thickness of the resin film for forming a core layer used in Examples will be described in Examples. The thickness of the resin film for forming a core layer described in Example is measured after the coating.

[Preparation of Flexible Printed Wiring Board]

(Formation of Electrical Wiring by Subtractive Process)

A photosensitive dry film resist ("PHOTEK" available from Hitachi Chemical Co., LTD., thickness: 25 μm) was attached to the copper foil surface of a polyimide film (polyimide: "UPILEX VT" available from Ube-Nitto Kasei Co., Ltd., thickness: 25 μm) with copper foil (copper foil: "NA-DFF" available from MITSUI MINING & SMELTING CO., LTD., thickness: 9 μm) on the one side with a roll laminator (HLM-1500 available from Hitachi Chemical Technoplant Co., Ltd.) under conditions of a pressure of 0.4 MPa, a temperature of 110° C., and a lamination speed of 0.4 m/min. Then, the laminated body was irradiated with ultraviolet rays (wavelength: 365 nm) from the photosensitive dry film resist side at a light intensity of 120 mJ/cm$^2$ through a negative photomask with a width of 50 μm by using an ultraviolet ray exposing machine ("EXM-1172" available from Oke factory Ltd.). The unexposed part of the photosensitive dry film resist was removed with a dilute solution of 0.1 to 5% by weight of sodium carbonate which has a temperature of 35° C. Then, the bared part of the copper foil where the photosensitivity dry film resist was removed was etched and removed by using ferric chloride solution. Thereafter, the photosensitivity dry film resist of the exposed part was removed by using 1 to 10% by weight of sodium hydroxide solution which has a temperature of 35° C.

Electrical wiring with L (line width)/S (void width)=60/190 µm was formed, and thus a flexible printed circuit board 40 was obtained.

[Formation of Ni/Au Plate]

Thereafter, the flexible printed circuit board 40 was degreased, soft-etched, washed with acid, immersed in a sensitizer for electroless Ni plating ("SA-100" available from Hitachi Chemical Co., Ltd.) at 25° C. for 5 minutes, washed with water, and then immersed in an electroless Ni plating solution ("ICP NICORON GM-SD solution" available from OKUNO CHEMICAL INDUSTRIES CO., LTD., pH4.6) with a temperature of 83° C. for 8 minutes to form an Ni coat with a thickness of 3 µm. The Ni coat was washed with pure water.

Then, the board was immersed in an immersion gold plating solution (100 mL of "HGS-500" available from Hitachi Chemical Co., Ltd. and 1.5 g of gold potassium cyanide/L; mixture bath) at 85° C. for 8 minutes to form an immersion gold plated coat with a thickness of 0.06 µm on the Ni coat. Accordingly, a flexible printed circuit board 40 in which the electrical wiring portion having no coverlay film was plated with Ni and Au was obtained.

[Preparation of Optical Waveguide in First Embodiment]

The surface-release PET film (Purex A31) as the protective film was removed from the resin film for forming a clad layer obtained as described above. Then, the resin film was thermally compression-bonded to the polyimide face (opposite to the electrical wiring surface) of the obtained flexible printed circuit board 40 under conditions of a pressure of 0.4 MPa, a temperature of 50° C., and a pressure time of 30 seconds after vacuumized to 500 Pa or less with a vacuum pressure laminator ("MVLP-500" available from Meiki Co., Ltd.) as a flat plate laminator. The laminated body was irradiated with ultraviolet rays (wavelength: 365 nm) at a light intensity of 4 J/cm$^2$ by using an ultraviolet exposure machine ("EXM-1172" available from Oke factory Ltd.). Next, the carrier film was removed, and then the laminated body was dried and cured by heating at 170° C. for 1 hour to form a lower clad layer 22.

Subsequently, the resin film for forming a core layer was laminated to the lower clad layer 22 with a roll laminator ("HLM-1500" available from Hitachi Chemical Techno-Plant Co., Ltd.) under conditions of a pressure of 0.4 MPa, a temperature of 50° C., and a lamination speed of 0.2 m/min. Then, through the negative photomask with an opening width of 50 µm, the laminated body was irradiated with ultraviolet rays (wavelength: 365 nm) at a light intensity of 0.6 J/cm$^2$ by using the above ultraviolet exposure machine and followed by post-exposure heat treatment at 80° C. for 5 minutes. Subsequently, the PET film as a carrier film were removed, and then the core patterns 24 were developed and formed with a developer (propylene glycol monomethyl ether acetate/N,N-dimethyl acetoamide=8/2 in mass ratio). Then, the laminated body was rinsed with a rinse solution (isopropanol), dried by heating at 100° C. for 10 minutes. In this way, the core pattern formation step of forming core patterns 24 was conducted.

The mirror formation process of forming inclined surfaces (mirrors 30) for changing an optical path was conducted by cutting with a dicing saw ("DAC552" available from Disco Corporation) from the side opposite to the flexible printed wiring board side of the obtained core patterns 24.

Subsequently, the upper clad layer formation step of forming an upper clad layer 26 was conducted by laminating the resin film for forming a clad layer with a thickness of 70 µm under conditions of a pressure of 0.4 MPa, a temperature of 120° C., and a pressure time of 30 seconds after vacuumized to 500 Pa or less with a vacuum pressure laminator ("MVLP-500" available from Meiki Co., Ltd.).

Then, the laminated body was irradiated with ultraviolet rays (wavelength: 365 nm) from the carrier film side at a light intensity of 250 mJ/cm$^2$ by using an ultraviolet exposure machine ("EXM-1172" available from Oke factory Ltd.) through a negative photomask with non-exposed areas of 150 µm×150 µm after the non-exposed areas were alignment with the parts on which mirrors 30 were formed. Subsequently, the opening formation step of forming openings 26a with a square pillar shape was conducted by removing the carrier film, etching the upper clad layer 26 with a developer (1% of potassium carbonate aqueous solution), washing with water, and then drying and curing the upper clad layer by heating at 170° C. for 1 hour.

When the obtained optical waveguide was bended, no cracks or breaks were seen around a portion where the mirrors 30 were formed. The positions of the mirrors 30 were confirmed well, viewed from the upper clad layer side and the flexible printed wiring board side of the obtained optical waveguide.

Example 2

Except for conducting the cover formation step of forming cover members 28 by attaching polyimide tape with a total thickness of 50 µm onto the openings after the openings 26a were formed, an optical waveguide with mirror was produced in the same manner as Example 1. When the obtained optical waveguide was bended, no cracks or breaks were seen around a portion where the mirrors 30 were formed. Due to having the cover member 28, there was no foreign matter attaching to the mirror 30. The positions of the mirrors 30 were confirmed well, viewed from the upper clad layer side and the flexible printed wiring board side of the obtained optical waveguide.

Example 3

In Example 1, the metal layer formation step was conducted by placing a metal mask on the openings 26a with an opening area of 300 µm×300 µm after the openings 26a were formed and by depositing Au as a metal layers in 0.5 µm with a deposition device ("RE-0025" available from FIRST GIKEN CO., LTD).

Subsequently, the resin film for forming a clad layer with a thickness of 70 µm was laminated to a surface side where the metal layers 34 were formed under conditions of a pressure of 0.4 MPa, a temperature of 120° C., and a pressure time of 30 seconds after vacuumized to 500 Pa or less with a vacuum pressure laminator ("MVLP-500" available from Meiki Co., Ltd.). Then, the laminated body was irradiated with ultraviolet rays (wavelength: 365 nm) from the carrier film side at a light intensity of 250 mJ/cm$^2$ by using an ultraviolet exposure machine ("EXM-1172" available from Oke factory Ltd.) through a negative photomask with exposed areas of 800 µm×800 µm after the exposed areas were aligned with the parts on which the metal layers 34 are formed. Subsequently, the resin filling step of forming resin members 32 was conducted by removing the carrier film, etching the clad layer with a developer (1% of potassium carbonate aqueous solution), washing with water, and drying and curing the washed upper clad layer by heating at 170° C. for 1 hour. Other steps were conducted in the same way as described above to obtain an optical wave guide. No cracks or breaks were seen around the portion where mirrors 30 were formed even during deposition process. Even when the obtained optical waveguide was bended after the resin members 32 were formed, no cracks or no breaks were seen around the portion where the mirrors 30 were formed.

The positions of the mirrors 30 were confirmed well, viewed from the upper clad layer side and the flexible printed wiring board side of the obtained optical waveguide.

Comparative Example 1

In Example 1, the core patterns 24 were formed, no mirrors 30 are formed, and then an upper clad layer not having openings was formed. Then, inclined surfaces (mirrors 30) for changing an optical path were formed by cutting with a dicing saw ("DAC552" available from Disco Corporation).

When bended, the obtained optical waveguide was cracked around the portion where mirrors 30 were formed.

Viewed from the upper clad layer side and the flexible printed wiring board side of the obtained optical waveguide, the boundary of the mirrors 30 was unclear, and the positions of the mirrors 30 was hardly confirmed.

Example 4

Preparation of Optical Waveguide with Mirror in Third Embodiment (Step 1) Preparation of Lower Clad Layer The resin film for forming a clad layer with a thickness of 15 μm was cut into 7 cm×2 cm, and the protective film was removed. Then, the resin film was thermocompression-bonded to a polyimide film (product name: "Kapton EN", available from DU PONT-TORAY CO., LTD., thickness: 25 μm) as the substrate 40 under conditions of a pressure of 0.4 MPa, a temperature of 120° C., and a pressure time of 30 seconds after vacuumized to 500 Pa or less with a vacuum pressure laminator ("MVLP-500" available from Meiki Co., Ltd.). The laminated body was irradiated with ultraviolet rays from the carrier film side at a light intensity of 4000 mJ/cm$^2$ with an ultraviolet exposure machine (product name: "EV-800" available from Hitachi Via Mechanics, Ltd.). After the carrier film was removed, the laminated body was cured by heating at 170° C. for 1 hour to obtain a lower clad layer 22.

(Step 2) Preparation of Core Patterns

The resin film for forming a core layer with a thickness of 50 μm, from which the protective film was removed, was laminated to the lower clad layer 22 with a roll laminator (product name: "HLM-1500," available from Nikka Equipment & Engineering Co., Ltd.) under conditions of a pressure of 0.5 MPa, a temperature of 50° C., and a lamination speed of 0.2 m/min. The laminated body was thermally compression-bonded to the lower clad layer under conditions of a pressure of 0.4 MPa, a temperature of 70° C., and a pressure time of 30 seconds after vacuumized to 500 Pa or less with a vacuum pressure laminator (product name: "MVLP-500," available from Meiki Co., Ltd.). Thereafter, through a negative photomask containing 4 channel patterns with a width of 60 μm and a length of 50 mm, the laminated body was irradiated with ultraviolet rays from the resin film for forming a core layer side at a light intensity of 800 mJ/cm$^2$ with an ultraviolet exposure machine (product name: "EV-800" available from Hitachi Via Mechanics, Ltd.) and heated at 80° C. for 5 minutes. Subsequently, the carrier film was removed, and then the core layer was etched with a developer (propylene glycol monomethyl ether acetate/N,N-dimethyl acetoamide=8/2 in mass ratio). Then, the core layer was washed with a rinse solution (isopropanol), and dried by heating at 100° C. for 10 minutes to form core patterns 24.

(Step 3) Preparation of Mirrors

Notches 48 with an inclined surface 31 inclined by 45° were formed on a side where the upper clad layer 11B would be formed by using a dicing saw ("DAC552" available from Disco Corporation) to form mirrors 30 on the core patterns 24. Two mirrors 30 were formed (at 50 mm apart) on one core pattern 24 as shown in FIG. 6.

(Step 4) Preparation of Upper Clad Layer

The resin film for a clad layer with a thickness of 70 μm, from which the protective film was removed was thermally compression-bonded and laminated to a surface where the core patterns 24 were formed under conditions of a pressure of 0.4 MPa, a temperature of 110° C., and a pressure time of 30 seconds after vacuumized to 500 Pa or less with a vacuum pressure laminator ("MVLP-500" available from Meiki Co., Ltd.). The laminate body was irradiated with ultraviolet rays (wavelength 365 nm) at a light intensity of 350 J/cm$^2$ by using a negative photomask with light shielding parts with shapes each corresponding to those of the openings 46a (at and around the positions overlapping the mirrors 30) and to those of the air vent paths 54 (width: 100 μm, length: 5 mm). Then, the career film was removed, and the upper clad layer 26 was patterned with a developer (1% of potassium carbonate aqueous solution). The patterned upper clad layer was washed with water, irradiated with ultraviolet rays (wavelength: 365 nm) at a light intensity of 4000 mJ/cm$^2$, and cured by heating at 170° C. for 1 hour.

(Step 5) Preparation of Cover Member

The protective film was removed from the resin film for forming a clad layer of 10 μm thickness obtained as described above as the adhesive layer. The resin film was laminated to a polyimide film ("UPILEX RN" available from Ube-Nitto Kasei Co., Ltd., thickness: 25 μm) with a vacuum laminator under the same conditions as those described above to form a cover member 28 with an adhesive layer. The carrier film was removed from the resin film for forming a clad layer which was laminated to the cover member 28. The laminated body was thermally compression-bonded to the surface on which the mirrors 30 were formed under the above-mentioned conditions. Then, the laminated body was cured by heating at 180° C. for 1 hour, and the cover member 28 was fixed to obtain an optical waveguide with mirror. In the optical waveguide with mirror, the space between mirrors 30 and the cover member 28 connected to the space outside of the optical waveguide with mirror at only one position through one air vent path 54.

[Confirmation of Infiltration of Cleaning Solution]

The obtained optical waveguide with mirror was immersed in pure water and washed. No liquid did flowed to the mirror, and light transmitted well even after the optical waveguide was picked up from pure water.

The obtained optical waveguide with mirror was immersed in a resin varnish for forming a clad layer as an adhesive of the optical waveguide. No liquid flowed to the mirror, and light transmitted well.

Example 5

Preparation of Optical Waveguide with Mirror in Fourth Embodiment

The steps were conducted until the upper clad layer resin film was laminated as the same manner as in Example 4. Then, when the upper clad layer 26 was exposed, the negative photomask was changed to the one provided with light shielding parts corresponding to only the openings 46a (at or around the positions overlapping the mirrors 30). After the upper clad layer was irradiated with ultraviolet rays (wavelength: 365 nm) at a light intensity of 350 J/cm², the carrier film was removed. Then, the resin film for forming a clad layer with a thickness of 20 μm from which the protective film was removed was laminated to the upper clad layer 26 that the ultraviolet had irradiated as the spacer layer 51. The laminated body was irradiated with ultraviolet rays (wavelength: 365 nm) at a light intensity of 350 J/cm² by using a negative photomask used for the irradiation of the upper clad layer 26 of Example 2. Then, the career film was removed, and the upper clad layer 26 and the spacer layer 51 were simultaneously patterned with a developer (1% of potassium carbonate aqueous solution). This patterning formed openings 46a on the upper clad layer 26 and openings 51a and air vent paths 64 (width: 100 μm, length: 5 mm) on the spacer layer 51. The patterned upper clad layer was washed with water, irradiated with ultraviolet rays (wavelength: 365 nm) at a light intensity of 4000 mJ/cm², and cured by heating at 170° C. for 1 hour.

Then, the cover member 28 was laminated in the same manner as Example 1 to obtain an optical waveguide with mirror. In the optical waveguide with mirror, the hollow space formed between the mirrors 30 and the cover member 28 connected to the space outside of the optical waveguide with mirror at only one position through one air vent path 64 provided on the spacer layer 51.

[Confirmation of Infiltration of Cleaning Solution]

The obtained optical waveguide with mirror was immersed in pure water and washed. No liquid flowed to the mirror, and light transmitted well even after the optical waveguide was picked up from the pure water.

The obtained optical waveguide with mirror was immersed in the resin varnish for forming a clad layer as an adhesive of the optical waveguide. No liquid flowed to the mirror, and light transmitted well.

Reference Example 1

Except for not forming air vent paths 54, an optical waveguide with mirror was prepared in the same manner as Example 4. In the obtained optical waveguide with mirror, the hollow void 46b did not connect to the space outside of the optical waveguide with mirror.

Because of the volume expansion of the hole-shaped space as the closed space when the reinforcing plate 15 was cured by heating, the mirrors 30 were transformed, causing light to not transmit well.

Reference Example 2

Except for forming two air vent paths 64 on the spacer layer for one hollow space, an optical waveguide with mirror was prepared in the same manner as Example 5. In the optical waveguide with mirror, the hollow space between the mirrors 30 and the cover member 28 connect to the space outside of the housing at two positions.

[Confirmation of Infiltration of Cleaning Solution]

The obtained optical waveguide with mirror was immersed in pure water and washed. The pure water was infiltrated into the mirror for changing an optical path. Light did not transmit well after the optical waveguide was picked up from the pure water.

DESCRIPTION OF THE SYMBOLS

10 Optical Waveguide
22 Lower Clad Layer
24 Core Pattern
26 Upper Clad Layer
26a, 46a Opening
28 Cover Member
30 Mirror
31 Inclined Surface
32 Resin Member
34 Metal Layer
40 Flexible Printed Circuit Board
42 Adhesive Layer
44 Optical Fiber Guide Pattern
51 Spacer Layer
54, 64 Air Vent Path
100 Optical Fiber Connector

The invention claimed is:

1. An optical waveguide with mirror, comprising:
a lower clad layer;
a core pattern formed above the lower clad layer;
a mirror formed on an inclined surface of the core pattern;
an upper clad layer covering a part other than the mirror on the core pattern; and
an opening with an approximate pillar shape, the opening being formed in the upper clad layer,
wherein the mirror is formed in the opening,
wherein inner walls of the opening are not provided on the same plane as the inclined surface, and
wherein a part of a side surface of the core pattern adjacent the mirror is exposed in the opening.

2. The optical waveguide with mirror according to claim 1, wherein the upper side, the lower side, and the both lateral sides of the inclined surface are placed in the opening.

3. The optical waveguide with mirror according to claim 1, further comprising a void between at least one of the upper side, the lower side, and the both lateral sides of the mirror and the inner wall of the opening, viewed in the thickness direction of the optical waveguide with mirror.

4. The optical waveguide with mirror according to claim 1, further comprising a clad inclined surface formed on the lower clad layer in the opening, the clad inclined surface being on the same plane as the inclined surface and continuing from the inclined surface, wherein the clad inclined surface extends outside at least one of the both lateral sides of the mirror.

5. The optical waveguide with mirror according to claim 1, wherein
the core pattern forms an optical path through which a light signal transmits,
the mirror changes the direction of a light signal so that a light signal transmits through the optical path exits from the clad layer and so that a light signal entering from the lower clad layer transmits through the optical path, and the mirror is formed on the optical path.

6. The optical waveguide with mirror according to claim 1, wherein the mirror is a dummy mirror for recognizing the position of the mirror.

7. The optical waveguide with mirror according to claim 1, wherein the opening is a void.

8. The optical waveguide with mirror according to claim 1, further comprising a cover member covering the opening.

9. The optical waveguide with mirror according to claim 8, wherein the void between the mirror and the cover member connects to the space outside of the optical waveguide with mirror at only one position.

10. The optical waveguide with mirror according to claim 9, further comprising an air vent path connecting the void to the space outside of the optical waveguide with mirror, the air vent path being formed on the lower clad layer or the upper clad layer.

11. The optical waveguide with mirror according to claim 9, further comprising a spacer layer between the upper clad layer and the cover member, wherein the air vent path connects the void to the space outside of the optical waveguide with mirror is formed on the spacer layer.

12. The optical waveguide with mirror according to claim 10, wherein the air vent path is formed by photolithography.

13. The optical waveguide with mirror according to claim 10, wherein the air vent path extends to the side opposite to the side on which the core pattern is provided in an axial direction of the core pattern in which the optical path is changed by the mirror.

14. The optical waveguide with mirror according to claim 1, further comprising a resin member filled in the opening.

15. The optical waveguide with mirror according to claim 14, wherein the resin member is formed from a photosensitive resin composition.

16. The optical waveguide with mirror according to claim 15, wherein
the lower clad layer, the upper clad layer, and the core pattern are formed from a resin composition for a lower clad layer, a resin composition for an upper clad layer, and a resin composition for a core pattern, respectively, and
the photosensitive resin composition is any one of the resin composition for a lower clad layer, the resin composition for an upper clad layer, and the resin composition for a core pattern.

17. The optical waveguide with mirror according to claim 1, wherein the mirror has a metal layer formed on the inclined surface.

18. The optical waveguide with mirror according to claim 17, wherein the metal layer is provided on at least one of the upper surface of the core pattern, the lateral surfaces of the core pattern, and the lower clad layer which are exposed in the opening.

19. The optical waveguide with mirror according to claim 17, wherein the metal layer formed on the inclined surface reflects a light signal transmitting through the core pattern and a light signal entering from the lower clad layer.

20. An optical fiber connector comprising:
the optical waveguide with mirror according to claim 1;
a substrate to which the optical waveguide is laminated; and
an optical fiber guide pattern laminated to the substrate, the optical fiber guide pattern forming a groove to which an optical fiber is introduced so that the optical fiber optically connects with the optical path of the core pattern.

* * * * *